United States Patent [19]
Muraki

[11] Patent Number: 5,363,170
[45] Date of Patent: Nov. 8, 1994

[54] ILLUMINATION DEVICE AND PROJECTION EXPOSURE APPARATUS USING THE SAME

[75] Inventor: Masato Muraki, Inagi, Japan

[73] Assignee: Canon Kabushiki Kaisha, Tokyo, Japan

[21] Appl. No.: 86,370

[22] Filed: Jul. 6, 1993

Related U.S. Application Data

[63] Continuation of Ser. No. 920,634, Jul. 28, 1992, abandoned.

[30] Foreign Application Priority Data

Aug. 9, 1991 [JP] Japan .................. 3-225221

[51] Int. Cl.$^5$ ............................................ G03B 27/54
[52] U.S. Cl. ............................. 355/67; 355/53; 355/70; 359/619; 362/268
[58] Field of Search .................. 355/53, 67, 70; 359/618, 619, 621; 362/268

[56] References Cited

U.S. PATENT DOCUMENTS

| | | | |
|---|---|---|---|
| 4,298,803 | 11/1981 | Matsuura et al. | 250/492.2 |
| 4,498,742 | 2/1985 | Uehara | 350/523 |
| 4,503,335 | 3/1985 | Takahashi | 250/548 |
| 4,659,225 | 4/1987 | Takahashi | 356/358 |
| 4,812,661 | 3/1989 | Owen | 250/491.1 |
| 4,874,954 | 10/1989 | Takahashi et al. | 250/548 |
| 4,939,630 | 7/1990 | Kikuchi et al. | 362/268 |
| 5,050,111 | 9/1991 | Ayata et al. | 364/559 |
| 5,091,744 | 2/1992 | Omata | 355/53 |
| 5,153,773 | 10/1992 | Muraki et al. | 359/519 |
| 5,237,367 | 8/1993 | Kudo | 355/67 |
| 5,300,971 | 4/1994 | Kudo | 355/67 |
| 5,305,509 | 4/1994 | Suzuki et al. | 355/53 |
| 5,309,198 | 5/1994 | Nakagawa | 355/67 |

*Primary Examiner*—Richard A. Wintercorn
*Attorney, Agent, or Firm*—Fitzpatrick, Cella, Harper & Scinto

[57] ABSTRACT

An illumination device and a projection exposure apparatus using the same are disclosed, wherein an incoherency imparting optical system serves to amplitude-divide a coherent beam from a radiation source into plural beams and to impart an optical path length difference, not less than a coherent length of the coherent beam, to the divided beams, an optical integrator receives the divided beams to define a secondary light source, a condensing optical system directs a secondary beam from the secondary light source to a surface to be illuminated, an afocal system disposed on a path between the radiation source and the optical integrator has a variable angular magnification, and changing the angular magnification of the afocal system is contributable to changing the section of each of the beams impinging on the optical integrator to thereby adjust the intensity distribution of the secondary light source.

57 Claims, 8 Drawing Sheets

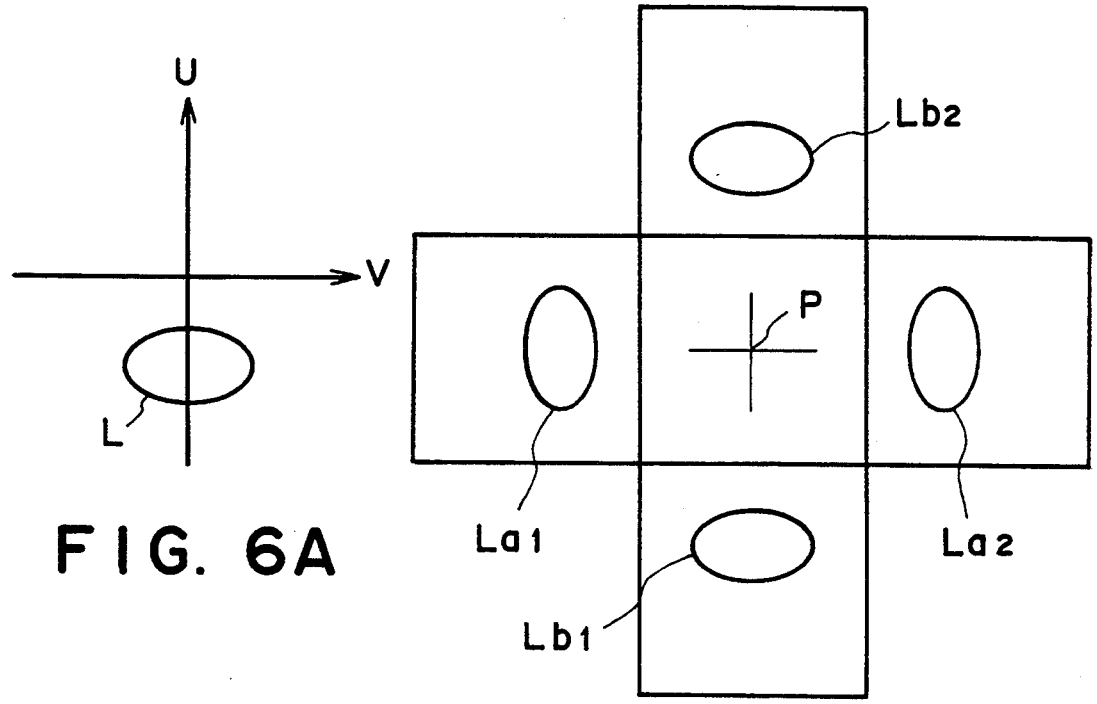
FIG. 6A
FIG. 6B
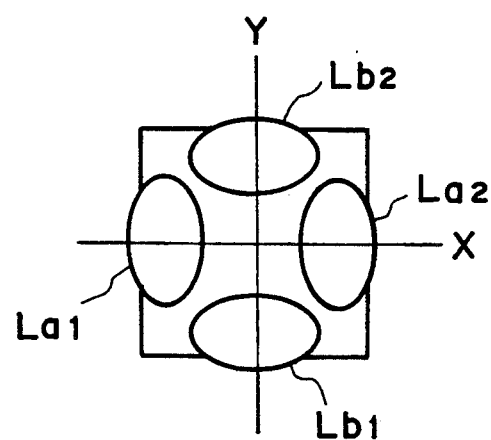
FIG. 6C

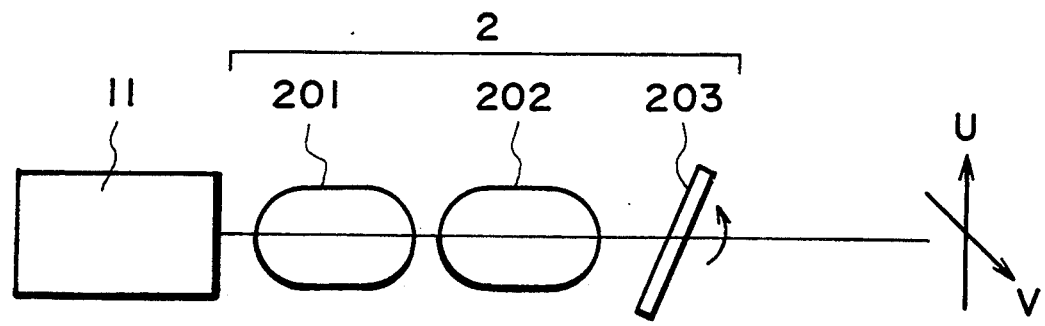
F I G. 7
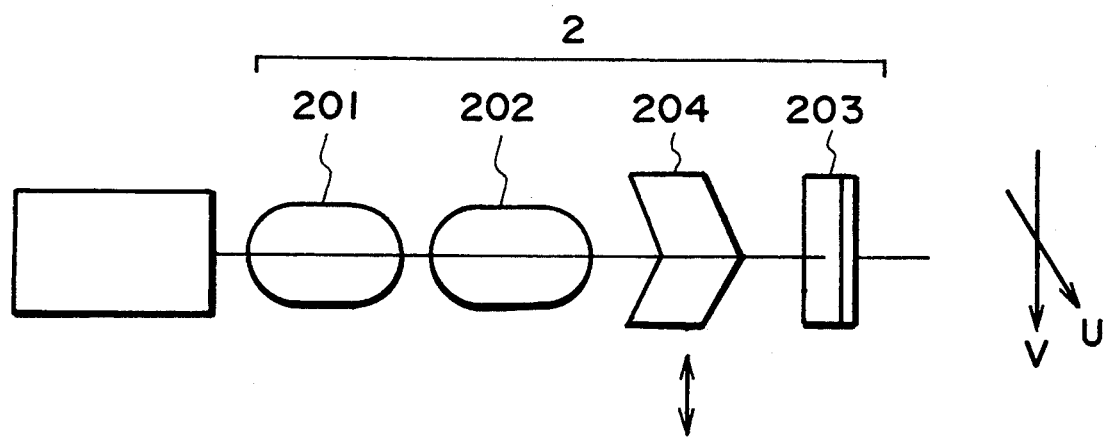
F I G. 8

ILLUMINATION DEVICE AND PROJECTION EXPOSURE APPARATUS USING THE SAME

This application is a continuation of Ser. No. 07/920,634 filed Jul. 28, 1991, now abandoned.

FIELD OF THE INVENTION AND RELATED ART

This invention relates to an illumination device and a projection exposure apparatus using the same. More particularly, the invention is concerned with an illumination device usable in a semiconductor device manufacturing exposure apparatus (called a stepper) for illuminating a pattern formed on a reticle in a manner easily attaining high resolution. In another aspect, the invention is concerned with a projection exposure apparatus using such an illumination device.

Semiconductor device manufacturing technology has recently been advanced significantly and, along this, the fine processing technique has been improved considerably. Particularly, the optical processing technique has pressed the fine processing into a submicron region, with manufacture of a device of 1-megabit DRAM. A conventionally adopted method for improving the resolution is mainly to enlarge the numerical aperture (NA) of an optical system while fixing an exposure wavelength. Recently, however, it has been proposed and practiced to use an exposure wavelength of i-line in place of g-line, in an attempt to improve the resolution in accordance with an exposure method using an ultra-high pressure Hg lamp.

Along the advancement of using g-line or i-line as the exposure wavelength, the resist process itself has been advanced. Such improvements in the optical system and in the process together have accomplished rapid advancement of optical lithography.

Generally it is known that the depth of focus of a stepper is in inverse proportion to the square of the NA (numerical aperture). It means that enhancing the resolution into a submicron order necessarily results in a problem of decreased depth of focus.

In consideration of this problem, many proposals have been made to use shorter wavelengths, as represented by an excimer laser, for enhancement of the resolution. It is known that the effect of using a shorter wavelength is in inverse proportion to the wavelength, and the shorter the wavelength is, the deeper the depth of focus is.

On the other hand, independently of using light of shorter wavelength, many proposals have been made to use a phase shift mask (phase shift method), in an attempt to improve the resolution. According to this method, a mask of conventional type is locally provided with a thin film that imparts to light incident on it a phase shift of 180 deg. relative to the light incident on the remaining portion. An example has been proposed by Levenson of the IBM corporation. Here, if the wavelength is denoted by $\lambda$, the parameter is denoted by $k_1$ and the numerical aperture is denoted by NA, then the resolution RP can be given by:

$$RP = k_1 \lambda / NA$$

It is known that the parameter $k_1$, whose practical range is usually taken as 0.7–0.8, can be improved to about 0.35 with this phase shift method.

There are many varieties of such a phase shift method, as referred to in a paper by Fukuda et al ("Nikkei Microdevices", July 1990, from page 108).

However, there remains many problems in practically using a phase shift mask of a spatial frequency modulation type to improve the resolution. Examples are as follows:

(1) Unestablished technique for forming a phase shift film;
(2) Unestablished CAD technique optimized to a phase shift film;
(3) Existence of a pattern to which no phase shift film can be put:
(4) Necessity of using a negative type resist (in relation to problem (3); and
(5) Unestablished technique for inspection and correction.

Under these circumstances, the phase shift mask method cannot be easily practiced in the semiconductor device manufacturing processes.

An exposure method and apparatus which attains enhanced resolution through an appropriately structured illumination device, has been proposed in Japanese patent application No. 28631/1991, filed in Japan on Feb. 22, 1991, in the name of the assignee of the subject application.

In this exposure method and apparatus, such an illumination system is adopted wherein particular attention is paid to a high spatial frequency region around a $k_1$ factor of 0.5, This illumination system assures a deep depth of focus in the high spatial frequency region.

SUMMARY OF THE INVENTION

Practical semiconductor device manufacturing processes include on one hand a process wherein high resolution of a pattern is required and, on the other hand, a process wherein a not so high resolution of a pattern is required. Thus, what is desired currently is a projection exposure apparatus which can meet the requirement of various resolution performances to be satisfied in various processes.

It is accordingly an object of the present invention to provide an illumination device or a projection exposure apparatus using the same, by which a suitable illumination method appropriate to the resolution and the configuration of a pattern, to be printed, can be selected; by which, in order to meet the integrated circuit manufacturing processes of a number of twenty or more, a conventional illumination system and a high resolution type illumination system can be easily used interchangeably in accordance with the target concerned, while allowing efficient utilization of light; or by which high resolution can be easily attained.

In accordance with an aspect of the present invention, there is provided an illumination device, comprising: a radiation source; an incoherency imparting optical system for amplitude-dividing a coherent beam from said radiation source into plural beams and for imparting an optical path length difference, not less than a coherent length of the coherent beam, to the divided beams; an optical integrator for receiving the divided beams to define a secondary light source; a condensing optical system for directing a secondary beam from said secondary light source to a surface to be illuminated; and an afocal system disposed on a path between said radiation source and said optical integrator, said afocal system having a variable angular magnification, wherein changing the angular magnification of said afocal system is contributable to changing the section of each of the beams impinging on said optical integrator.

In accordance with another aspect of the present invention, there is provided a projection exposure apparatus, comprising: a radiation source; an incoherency imparting optical system for amplitude-dividing a coherent beam from said radiation source into plural beams and for imparting an optical path length difference, not less than a coherent length of the coherent beam, to the divided beams; an optical integrator for receiving the divided beams to define a secondary light source; a condensing optical system for directing a secondary beam from said secondary light source to a reticle; a projection optical system for projecting an image of a circuit pattern of the reticle, illuminated with the secondary beam, to a wafer; and an afocal system disposed on a path between said radiation source and said optical integrator, said afocal system having a variable angular magnification, wherein changing the angular magnification of said afocal system is contributable to changing the section of each of the beams impinging on said optical integrator.

In accordance with a further aspect of the present invention, there is provided a semiconductor device manufacturing method, comprising the steps of: amplitude-dividing a coherent beam from a radiation source into plural beams: imparting an optical path length difference, not less than a coherent length of the coherent beam, to the divided beams; projecting the divided beams to a secondary light source forming member to define a secondary light source with the divided beams; illuminating a pattern with a secondary beam from the secondary light source; changing the section of the coherent beam so as to select one of (i) a first state wherein a light intensity distribution having a higher intensity at a central portion thereof than at a peripheral portion thereof, is formed on a light entrance surface of the secondary light source forming member and (ii) a second state wherein a light intensity distribution having a higher intensity at a peripheral portion thereof than at a central portion thereof, is formed on the light entrance surface of the secondary light source forming member; and projecting an image of the pattern to a wafer for transfer of the pattern onto the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A–6C are schematic views for explaining beam sections and intensity distributions, at some locations in FIG. 1.

FIG. 7 is a schematic view of a beam section adjusting means of FIG. 1.

FIG. 8 is a schematic view of a beam section adjusting means of FIG. 1.

DESCRIPTION OF THE PREFERRED EMBODIMENTS

Figure 1:
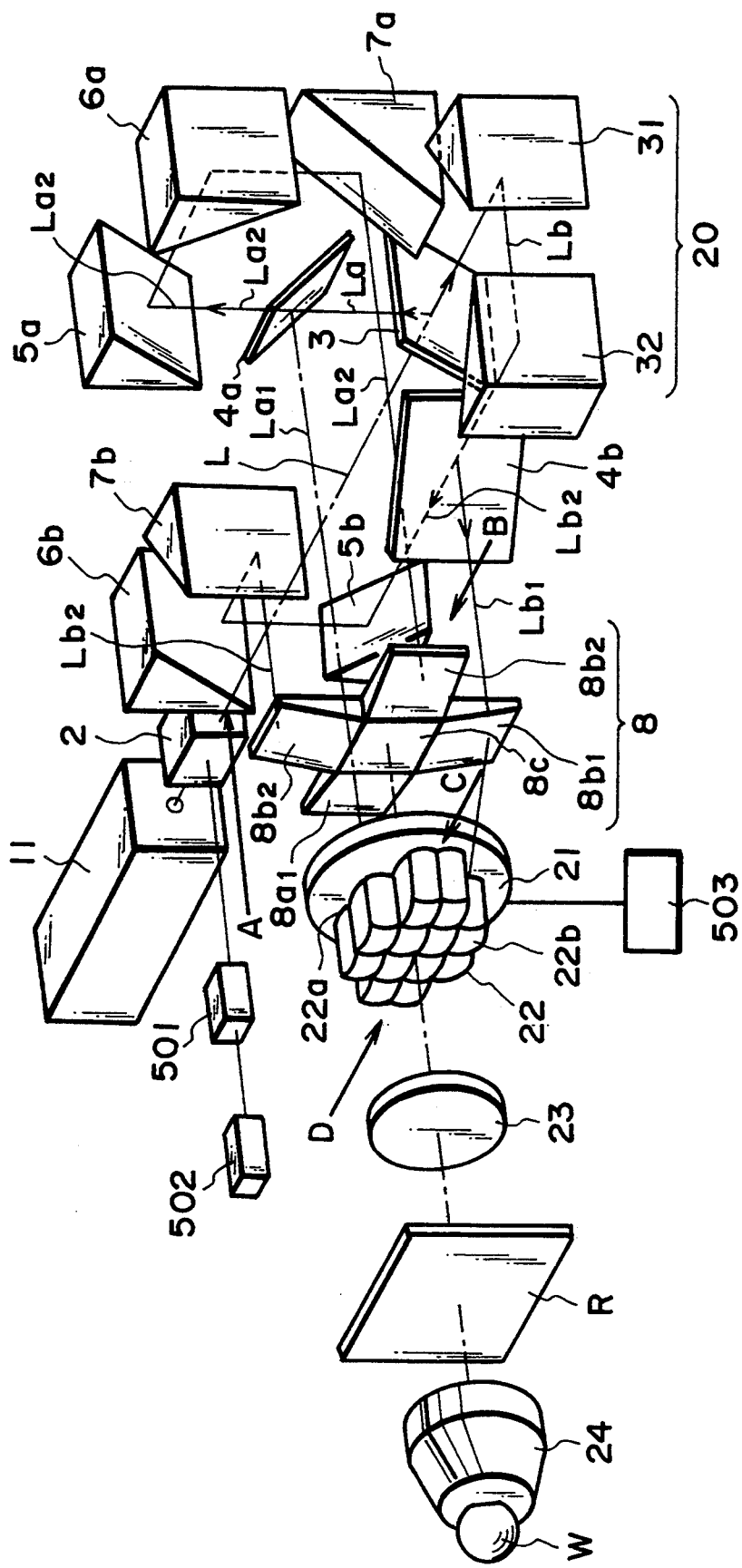
FIG. 1 is a perspective view schematically showing a main portion of a first embodiment of the present invention.

FIG. 1 is a schematic view of an illumination device and a projection exposure apparatus using the same, according to an embodiment of the present invention. In this embodiment, the invention is applied to a reduction projection type exposure apparatus, called a stepper.

In FIG. 1, denoted at 11 is a light source which comprises a KrF excimer laser having a relatively small spatial coherency (a large number of transverse modes). The light source 11 produces parallel coherent light.

Denoted at 2 is a beam section adjusting means comprising an afocal system which serves to adjust the sectional shape and the position of incidence, for example, of each of plural beams incident on the light entrance surface $22a$ of an optical integrator 22, to be described later, to thereby adjust the intensity distribution of a secondary light source as formed on the light exit surface of the optical integrator 22. The structure of the beam section adjusting means 2 will be described later.

Denoted at 3 is a first beam splitter, for amplitude-dividing the coherent light passing through an optical member 2 into two, i.e., reflected light La and transmitted light Lb. The light La reflectively divided by the first beam splitter 3 is again amplitude-divided by a second beam splitter $4a$ into two, i.e., reflected light $La_1$ and $La_2$. Of these lights, the reflectively divided light $La_1$ impinges on one wedge prism $8a_1$ of a first deflecting member 8 which comprises four wedge prisms $8a_1$, $8a_2$, $8b_1$ and $8b_2$ for refractively deflecting lights incident thereon and for superposing them one upon another. Denoted at $8c$ is a member for mechanically connecting the four wedge prisms $8a_1$–$8b_2$.

The light $La_2$ transmissively divided by the second beam splitter $4a$ is reflected by reflection mirrors $5a$, $6a$ and $7a$ in this order and, while being rotated by 180 deg. with respect to the section of light and relative to the light $La_1$, it impinges on one ($8a_2$) of the wedge prisms of the first deflecting member 8.

On the other hand, the light Lb transmissively divided by the first beam splitter 3 is reflected by reflection mirrors 31 and 32, and then it is again amplitude-divided by a third beam splitter $4b$ into two, i.e., reflected light $Lb_1$ and $Lb_2$.

Of these lights, the reflectively divided light $Lb_1$ impinges on one ($8b_1$) of the wedge prisms of the first deflecting member 8. Also, the light $Lb_2$ transmissively divided by the third beam splitter $4b$ is reflected by mirrors $5b$, $6b$ and $7b$ in this order and, while being rotated by 180 deg. with respect to the section of light and relative to the light $Lb_1$, it impinges on one ($8b_2$) of the wedge prisms of the first deflecting member 8.

The four lights $La_1$, $La_2$, $Lb_1$ and $Lb_2$ incident on the first deflecting member 8 are refractively deflected by corresponding wedge prisms $8a_1$, $8a_2$, $8b_1$ and $8b_2$. Then, they go through a second deflecting member 21 (comprising a wedge prism) and, thereafter, they are projected on the light entrance surface 22a of the optical integrator 22 (comprising plural bar lenses) while being superposed one upon another. More specifically, the lights $La_1$ and $La_2$ projected from the first deflecting member 8 are so incident on the light entrance surface 22a that they are substantially symmetrical with each other with respect to the central axis (optical axis) of the optical integrator 22. Also, the lights $Lb_1$ and $Lb_2$ are projected from the first deflecting member onto the light entrance surface 22a similarly. Here, the four lights $La_1$–$Lb_2$ are incoherent with each other, to be described later. The second deflecting member 21 can be rotated about the optical axis of a condenser lens 23 (to be described later) by a driving means 503.

The light exit surface 22b of the optical integrator 22 provides a secondary light source plane on which a number of secondary light sources are formed. The number of the secondary light sources is determined by the number of the bar lenses constituting the optical integrator 22 and the number of lights incident thereon. The light from the light exit surface 22b of the optical integrator 22 is collected by the condenser lens (condensing optical system) 23 so as to illuminate a reticle R with the collected light.

Here, the secondary light source on the light exit surface 22b of the optical integrator 22 is formed on a pupil of a projection optical system (projection lens system) 24 to be described later. And, through this projection lens system 24, a circuit pattern of the reticle R is projected in a reduced scale on the surface of a wafer W, at a predetermined magnification.

In this embodiment, the beam splitters 3, 4a and 4b (first to third half mirrors) provide a light dividing means while, on the other hand, the optical components disposed along the light path from the first beam splitter 3 to the first deflecting member 8 provide an optical means (incoherency imparting optical system) 20 for transforming coherent light into incoherent light.

The four lights $La_1$–$Lb_2$ incident on the wedge prisms of the first deflecting member 8 have a difference in optical path length from the first beam splitter 3 to the first deflecting member 8, and the components are so arranged that such an optical path difference to be provided is not less than the coherent length L (with respect to time) as determined by the bandwidth of the light source 11.

In this embodiment, the optical path lengths for the lights $La_1$–$Lb_2$ are so set as to satisfy the following relations:

$$Lb_2 > La_2 > Lb_1 > La_1$$

$$Lb_2 - La_2 = La_2 - Lb_1 = Lb_1 - La_1 = L$$

In this manner, incoherency is imparted to these four lights and, as a result, substantially no interference occurs when they are superposed one upon another on the light entrance surface of the optical integrator 22.

FIG. 7 is a sectional view of a main portion of the beam section adjusting means 2. The adjusting means 2 of this embodiment comprises (i) an optical system 201 having a cylindrical lens, for example, for continuously enlarging or reducing the beam section of the coherent light from the light source 11 in a U-direction, (ii) an optical system 202 having a cylindrical lens, for example, for continuously enlarging or reducing the beam section in a V-direction, orthogonally intersecting with the U-direction, and (iii) a parallel flat plate 203 for translationally shifting the light in the U-direction.

The optical systems 201 and 202 constitute an afocal system and, by changing the angular magnification of this afocal system, the beam sectional shape of the received light can be changed. Also, by changing the tilt angle of the parallel plate 203, the position of incidence of light upon the optical integrator 22 can be changed. In this manner, the intensity distribution of the secondary light source can be adjusted.

In this embodiment, the afocal system may be provided by a zoom lens system and, on that occasion, at least one lens of the zoom lens system may be displaced to change the angular magnification. Further, as the optical systems 201 and 202, plural afocal systems having different angular magnifications may be used and, on that occasion, one of them may be selectively disposed to change the angular magnification.

With the above-described arrangement of the present embodiment, the intensity distribution on the light exit surface 22b of the optical integrator 22, namely, the secondary light source, can be adjusted in accordance with the orientation characteristic and required resolution performance of the pattern on a surface of a reticle R concerned. This assures an illumination device of high resolution.

Next, the relationship between the projection optical system 24 and the optical integrator 22 in this embodiment will be explained.

Figure 2:
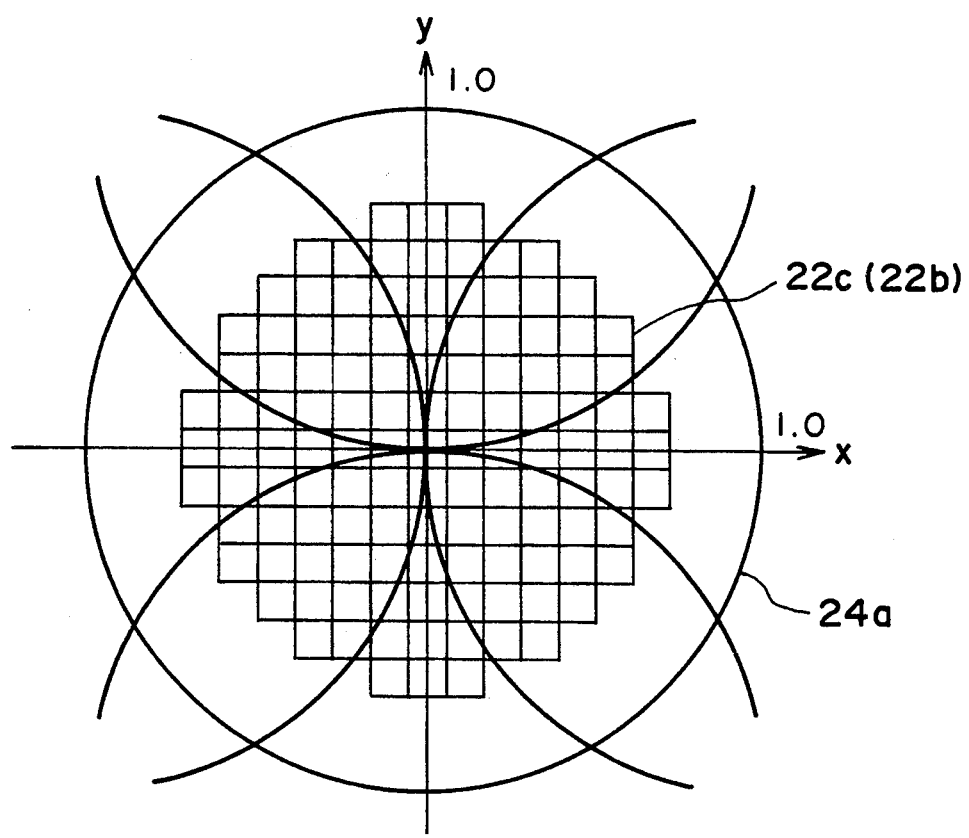
FIG. 2 is a schematic view for explaining the relationship between the pupil of a projection optical system and an optical integrator.

FIG. 2 is a schematic view for explaining the relationship between the pupil plane 24a of the projection optical system 24 and the light exit surface (secondary light source) 22b of the optical integrator 22.

The shape of the optical integrator 22 corresponds to the shape of the effective light source as formed on the pupil plane 24a of the projection optical system 24. This is illustrated in FIG. 2, wherein, on the pupil plane 24a of the projection optical system 24, the shape of the image 22c of the effective light source on the light exit surface 22b, to be formed thereon, is drawn superposedly. For standardization, the radius of the pupil 242a of the projection optical system 24 is taken as 1 and, within this pupil 24a, the plural small lenses constituting the optical integrator 22 are imaged to form an effective light source image 22c. In this embodiment, each small lens of the optical integrator has a square shape.

Here, orthogonal axes which determine the major directions to be relied upon in designing a semiconductor circuit pattern, are taken on x and y axes. These directions correspond to the major directions of a pattern formed on the reticle R, and correspond to the directions of the outside peripheral configuration of the reticle, which is square.

The case where the high resolution illumination system provides its power is a case where the $k_1$ factor is at a level near 0.5.

In consideration thereof, in this embodiment, the components of the beam section adjusting means 2 are used to change the intensity distribution on the light exit surface 22b of the optical integrator 22.

Figure 3A:
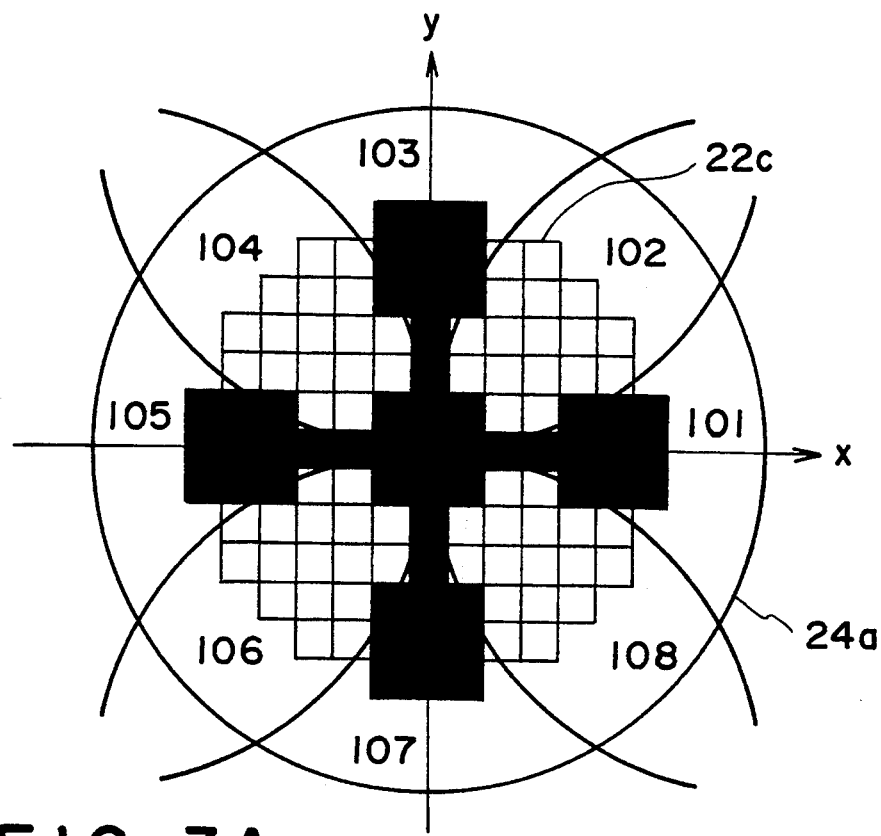
FIGS. 3A and 3B are schematic views each showing an intensity distribution of a secondary light source image formed on a pupil of a projection optical system.
Figure 3B:
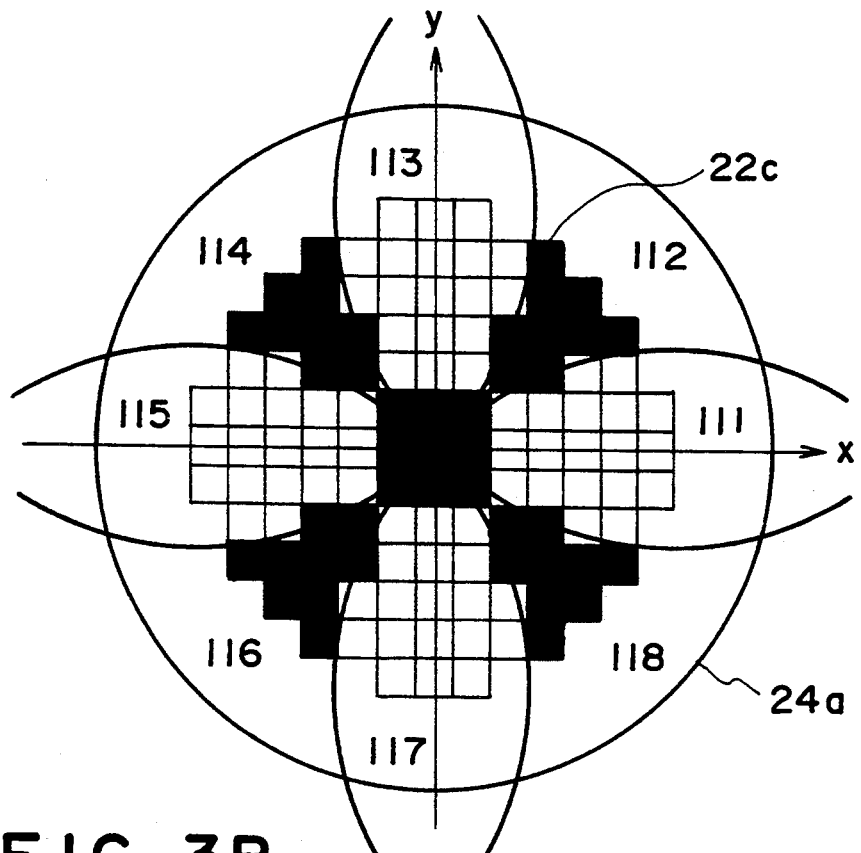

FIGS. 3A and 3B are schematic views, respectively, each showing an intensity distribution on the light exit surface 22b (i.e., secondary light source) of the optical integrator 22. In these drawings, the painted areas denote those zones having a relatively low light intensity, while the blank areas denote those zones having a relatively high light intensity.

FIG. 3A illustrates an intensity distribution on the pupil plane 24a in a case when the directions with respect to which high resolution of a pattern is required are on the x and y directions. Assuming the circle representing the pupil 24a as $x^2 + y^2 = 1$, the following four circles should now be considered:

$$(x-1)^2 + y^2 = 1$$

$$x^2 + (y-1)^2 = 1$$

$$(x+1)^2 + y^2 = 1$$

$$x^2 + (y+1)^2 = 1$$

With these four circles, the circle representing the pupil 24a is divided into eight zones 101–108.

The illumination system of high resolution and deep depth of focus with respect to the x and y directions, is accomplished in this embodiment by projecting, with priority, the light to small lens groups in such zones denoted by reference numerals of even number, that is, the zones 102, 104, 106 and 108. Since the small lenses adjacent to the origin (x=0, y=0) are mainly contributable to enlarging the depth with respect to a rough pattern, whether much of the light at the central portion (near the optical axis) is to be selected or not is a matter of selection to be determined by the pattern to be printed.

In the example of FIG. 3A, little light comes from the small lenses about the center. The portion outside the optical integrator 22 is light-blocked by an integrator holding member (not shown) within the illumination system. In FIGS. 3A and 3B, for easy understanding of the relationship between the small lenses to be light-blocked and the pupil 24a of the projection lens, the pupil 24a and the effective light source image 22c of the optical integrator are drawn in superposition.

On the other hand, FIG. 3B illustrates an example of an intensity distribution on an occasion when high resolution is required with respect to patterns of ±45 deg. Similarly to the FIG. 3A case, there is illustrated the relationship between the pupil 24a and the effective light source image 22c of the optical integrator 22. For such ±45 deg. patterns, under the same conditions as in the preceding case, the following four circles are to be considered:

$$(x - 1/\sqrt{2})^2 + (y - 1/\sqrt{2})^2 = 1$$

$$(x + 1/\sqrt{2})^2 \quad (y - 1/\sqrt{2})^2 = 1$$

$$(x + 1/\sqrt{2})^2 + (y + 1/\sqrt{2})^2 = 1$$

$$(x - 1/\sqrt{2})^2 + (y - 1/\sqrt{2})^2 = 1$$

By drawing these four circles in superposition on the pupil 24a, like the FIG. 3A case, the pupil 24a is divided into eight zones 111–118. In this case, the zones which are contributable to enhancement of resolution to the ±45 deg. patterns are those zones denoted by reference numerals of odd number, that is, the zones 111, 113, 115 and 117. Thus, by selecting with priority the light from the small lenses of the optical integrator 22 which are present in these zones, to such ±45 deg. patterns the depth of focus is considerably enlarged at a $k_1$ factor of about 1.5.

As described, in this embodiment, the angular magnification of the afocal system and the angle of inclination of the parallel plate (both providing the beam section adjusting means 2) are controlled so as to assure that: in a case when the minimum linewidth of a circuit pattern of a reticle is relatively large, the secondary light source is formed in proximity to the optical axis; whereas in a case when the minimum linewidth of the circuit pattern of the reticle is small, the secondary light source is formed off the optical axis.

Next, the intensity distribution on the light exit surface of the optical integrator, namely, the intensity distribution of the secondary light source, in this embodiment, will be explained in more detail.

Figure 4A:
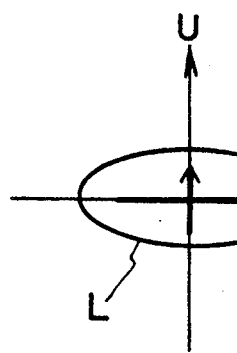
FIGS. 4A–4D are schematic views for explaining beam sections and intensity distributions, at some locations in FIG. 1.
Figure 4B:
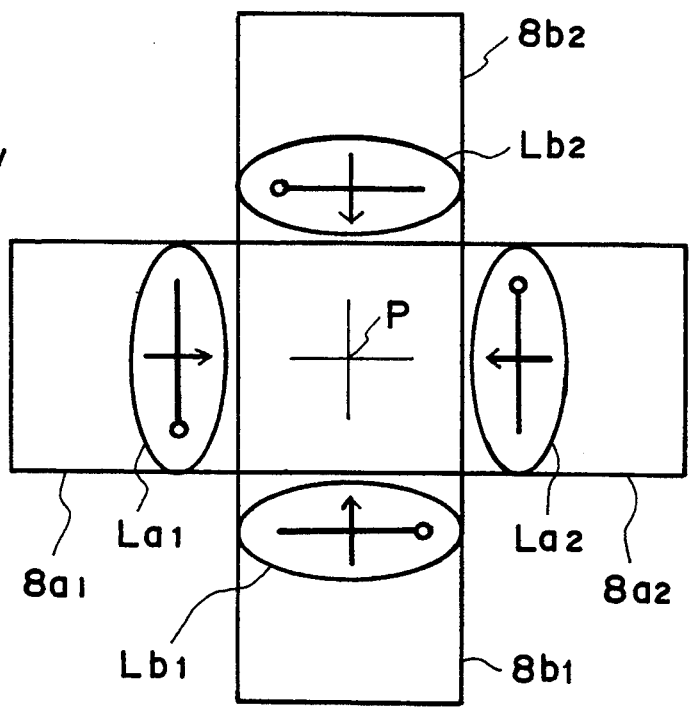
Figure 4C:
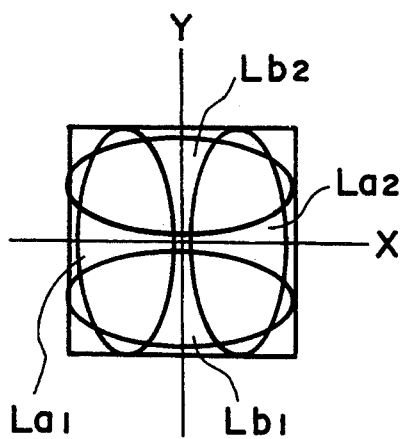

Reference character L in FIG. 4A depicts the reference orientation, on the plane A, of the section of light emitted from the light source 11, after the adjustment of the shape of the beam section (section of light) through the beam section adjusting means 2. Here, the orientations of the lights $La_1$, $La_2$, $Lb_1$ and $Lb_2$ incident on the wedge prisms $8a_1$, $8a_2$, $8b_1$ and $8b_2$, on the sectional plane B, are in a radial disposition about a reference point P (which is on the optical axis of the condenser lens 23) as illustrated in FIG. 4B. Here, FIG. 4B shows the four lights $La_1$–$Lb_2$ incident on the first deflecting member 8, as viewed from the wafer W side.

The four lights refractively deflected by the four wedge prisms $8a_1$–$8b_2$ are superposed one upon another on the light entrance surface 22a (on the plane C) of the optical integrator 22. As a result, the light intensity distribution formed on the light entrance surface 22a is a Gaussian distribution of symmetrical shape, such as shown in FIG. 4D.

Figure 4D:
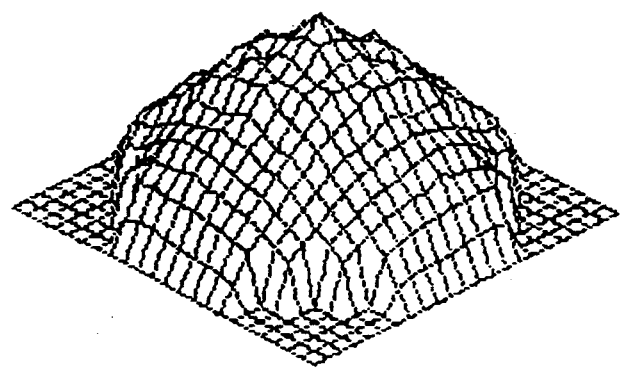

While in the foregoing the shape of the secondary light source effective to enlarge the depth of focus with respect to the x and y directions has been explained with reference to FIG. 3A, it is now assumed that the intensity distribution of the secondary light source to be used in normal projection exposure is such as shown in FIG. 4D.

Figure 5A:
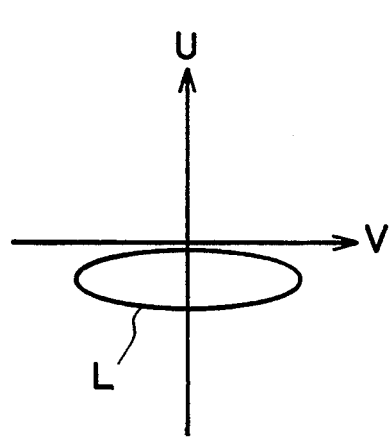
FIGS. 5A–5D are schematic views for explaining beam sections and intensity distributions, at some locations in FIG. 1.
Figure 5B:
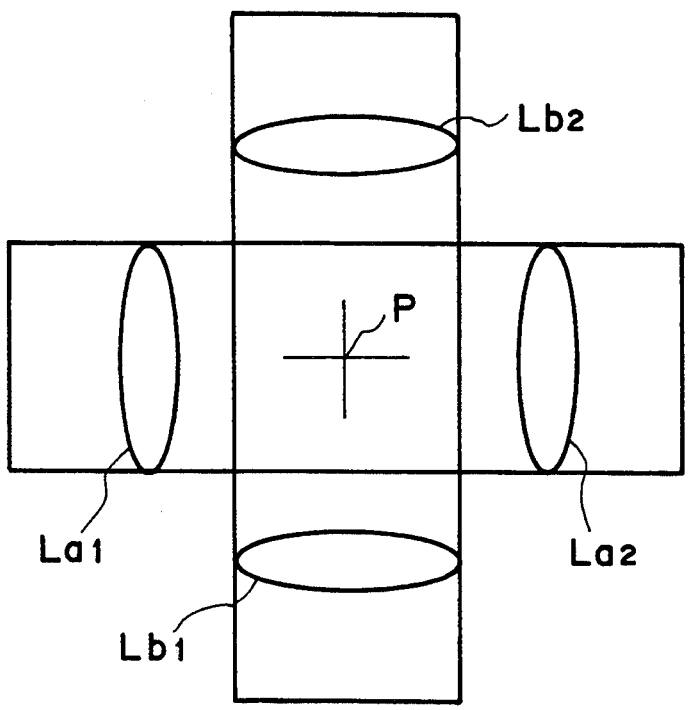

If the beam section adjusting means 2 is used to reduce the beam section L of FIG. 4A in the U-direction and the parallel plate 203 is moved to shift the light translationally, then the resultant beam section is such as shown in FIG. 5A. Also, the four lights $La_1$–$Lb_2$ incident on the wedge prisms $8a_1$–$8b_2$, on the sectional plane B, are such as shown in FIG. 5B.

Figure 5C:
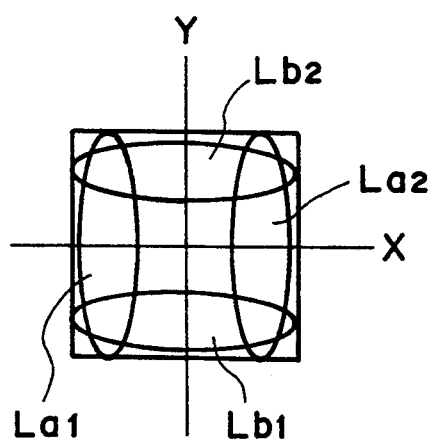
Figure 5D:
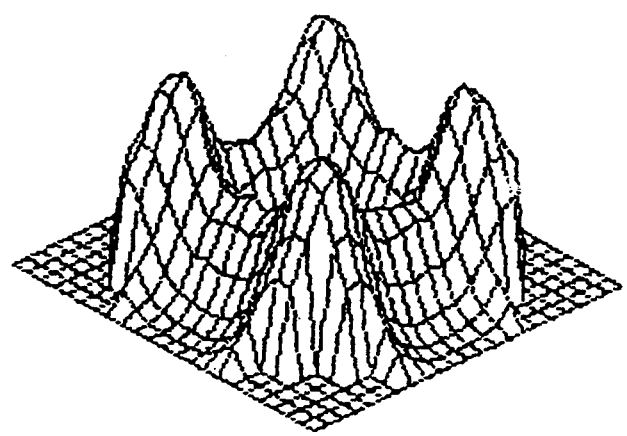

Here, the four lights are superposed one upon another on the light entrance surface 22a of the optical integrator, such as shown in FIG. 5C. Namely, on the light entrance surface 22a, there is provided an intensity distribution having a low intensity on the x and y axes, as shown in FIG. 5D.

Here, "the light intensity is low" means that the quantity of light passing through the small lens of the optical integrator is low or, in an extreme case, it may be equivalent to such light that is blocked. As a result, a secondary light source of an intensity distribution like that shown in FIG. 3A or 3B is accomplished.

Also, while an intensity distribution of a secondary light source which is effective to enlarge the depth of focus with respect to the 45 deg. directions has been explained with reference to FIG. 3B, such an intensity distribution of a secondary light source may be accomplished by reducing the beam section L of FIG. 4A in the V-direction such as shown in FIG. 6A and by translationally shifting the same in the U-direction, through the beam section adjusting means.

FIG. 6B illustrates the four lights $La_1$–$Lb_2$, on the sectional plane B, which are incident on the wedge prisms $8a_1$–$8b_2$. FIG. 6C illustrates the four lights as incident on the light entrance surface $22a$ (sectional plane C) of the optical integrator 22.

The beam section adjusting means 2 of this embodiment is drive-controlled by means of a controller 501, for adjustment of the beam sectional shape of coherent light passing therethrough as well as the state of incidence of the same upon the light entrance surface $22a$ of the optical integrator 22.

Figure 10:
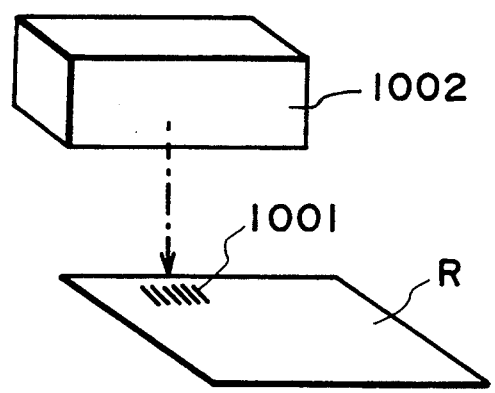
FIG. 10 is a schematic view for explaining reading a bar code on a reticle surface.

In the present embodiment, as shown in FIG. 10, for example, a bar code 1001 may be provided in a portion of a reticle R, which bar code can be read by a bar code reader (input means) 1002 by which the information such as the configuration or necessary resolution or the like of the pattern formed on the reticle R can be detected. The detected pattern information may be inputted to the controller 501 by an input means 502 which may comprise an operation panel or the like. The controller 501 then discriminates an appropriate intensity distribution of the secondary light source corresponding to the pattern information supplied from the input means 502, and controls the beam section adjusting means 2 in accordance with the discrimination, whereby an intensity distribution such as shown in FIG. 3A or 3B, for example, is accomplished.

Thus, the present embodiment may be provided with such input means 502 which may comprise an operation panel, for example, for reading the information in the form of a bar code about the minimum linewidth pattern of a circuit pattern of a reticle and for inputting the information into the controller 501, such that the angular magnification of the afocal system (beam section adjusting means 2) may be controlled by the controller in accordance with inputted information.

Also, it is within the scope of the present invention to modify the above-described embodiment as follows:

(a) As shown in FIG. 8, the beam section adjusting means 2 may comprise an arrangement wherein, between the optical system 202 for enlarging or reducing the beam section and the parallel plate 203, an optical system 204 comprising a roof prism for bisecting the light is disposed.

Figure 9A:
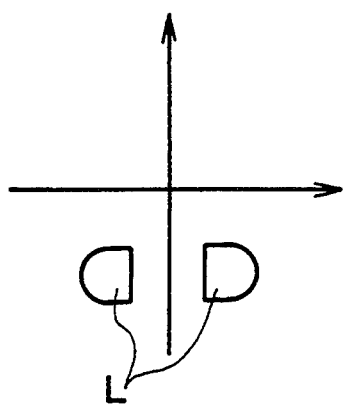
FIGS. 9A–9C are schematic views for explaining beam sections, at some points, as adjusted by the beam section adjusting means of FIG. 8.
Figure 9B:
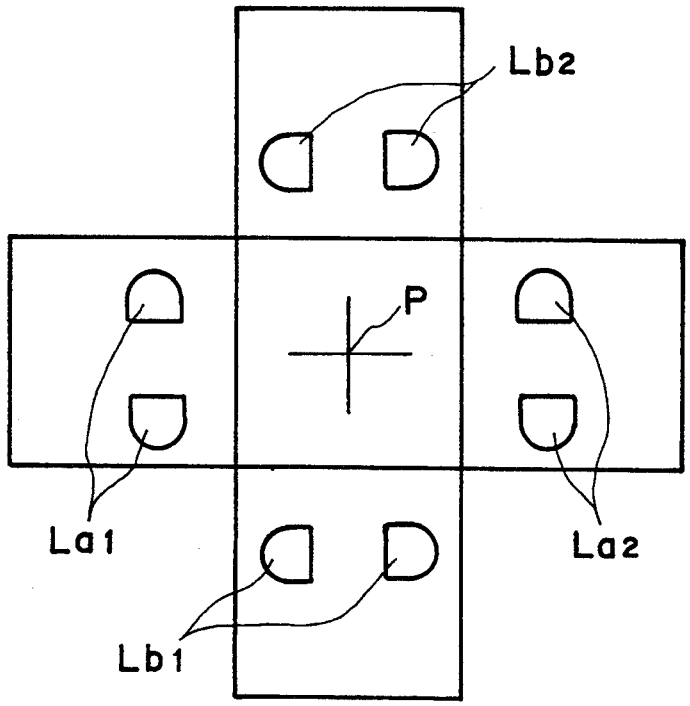
Figure 9C:
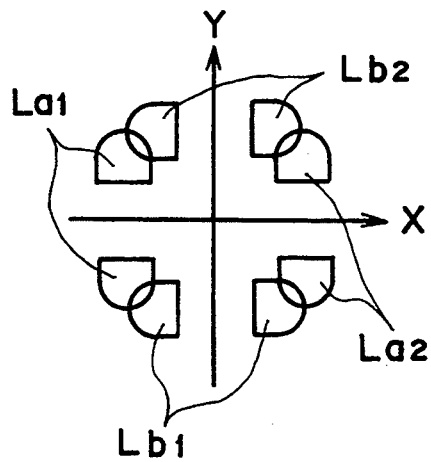

Here, FIGS. 9A–9C illustrate the beam section L and the state of incidence, on the sectional plane B, of the four lights $La_1$–$Lb_2$ impinging on the wedge prisms $8a_1$–$8b_2$ as well as the state of incidence of the lights upon the light entrance surface $22a$ (sectional plane C) of the optical integrator 22, in a case when the beam section adjusting means 2 shown in FIG. 8 is used.

(b) By using the beam section adjusting means 2, a circular intensity distribution or a ring-like intensity distribution of rectangular shape may be defined on the light entrance surface $22a$ of the optical integrator 22.

(c) For enhancing the sharpness of the intensity distribution of the secondary light source, at least one stop member having an opening corresponding to the light intensity distribution of the secondary light source may be detachably inserted to at least one of the light entrance surface and the light exit surface of the optical integrator 22.

When, on that occasion, orthogonal coordinates are set with their origin placed on the optical axis, a secondary light source formed off the optical axis may include separate or individual light source portions in four quadrants of the orthogonal coordinates. Also, a mechanism for changing the shape of the opening of the stop member by changing the intensity distribution of the secondary light source, may be added.

(d) Particularly, in relation to the manufacture of semiconductor devices, the section of the single coherent beam may be changed, for illumination of a circuit pattern having a relatively large minimum linewidth and for illumination of a circuit pattern having a relatively small minimum linewidth, so as to select one of (i) a first state wherein a substantially uniform light intensity distribution having a higher intensity at its central portion than at its peripheral portion is formed on the light entrance surface of a secondary light source forming member and (ii) a second state wherein a light intensity distribution having a higher intensity at its peripheral portion than at its central portion is formed on the light entrance surface of the secondary light source forming member.

In accordance with the present invention, as described hereinbefore, in accordance with the fineness or orientation of a pattern formed on a reticle to be projected and printed, an illumination system suitable to the pattern concerned is selected, to thereby accomplish an illumination device or a projection exposure apparatus using the same which assures projection exposure of optimum and high resolution.

Also, in accordance with the present invention, when a not so fine pattern is to be printed, an illumination system of conventional type can be used as it is. And, when a fine pattern is to be printed, an illumination device of small loss of light quantity and easily assuring high resolution can be used, with an advantageous effect of enlarged depth of focus.

Further, the image quality can be controlled only with modification of the illumination system. No limitation is applied to the projection optical system. Therefore, it is possible to accomplish an illumination device or a projection exposure apparatus using the same, with an advantage that major performance of the optical system such as distortion or image plane characteristic, for example, can be retained stably irrespective of the modification to the illumination system.

While the invention has been described with reference to the structures disclosed herein, it is not confined to the details set forth and this application is intended to cover such modifications or changes as may come within the purposes of the improvements or the scope of the following claims.

What is claimed is:

1. An illumination device, comprising:
   a radiation source;
   an incoherency imparting optical system for amplitude-dividing a coherent beam from said radiation source into plural beams and for imparting an optical path length difference, not less than a coherent length of the coherent beam, to the divided beams;
   an optical integrator for receiving the divided beams to define a secondary light source;
   a condensing optical system for directing a secondary beam from said secondary light source to a surface to be illuminated; and an afocal system disposed on a path between said radiation source and said optical integrator, said afocal system having a variable angular magnification, wherein changing the angular magnification of said afocal system is contributable to changing the section of each of the beams impinging on said optical integrator.

2. A device according to claim 1, further comprising a parallel plate disposed on the path between said radiation source and said optical integrator and having a variable tilt angle with respect to the path, wherein changing the tilt angle of said parallel plate is contributable to changing the position of incidence of each of the divided beam upon said optical integrator.

3. A projection exposure apparatus, comprising:
a radiation source;
an incoherency imparting optical system for amplitude-dividing a coherent beam from said radiation source into plural beams and for imparting an optical path length difference, not less than a coherent length of the coherent beam, to the divided beams;
an optical integrator for receiving the divided beams to define a secondary light source;
a condensing optical system for directing a secondary beam from said secondary light source to a reticle;
a projection optical system for projecting an image of a circuit pattern of the reticle, illuminated with the secondary beam, to a wafer; and
an afocal system disposed on a path between said radiation source and said optical integrator, said afocal system having a variable angular magnification, wherein changing the angular magnification of said afocal system is contributable to changing the section of each of the beams impinging on said optical integrator.

4. An apparatus according to claim 3, further comprising a parallel plate disposed on the path between said radiation source and said optical integrator and having a variable tilt angle with respect to the path, wherein changing the tilt angle of said parallel plate is contributable to changing the position of incidence of each of the divided beams upon said optical integrator.

5. An apparatus according to claim 3, wherein said afocal system comprises a zoom lens system at least one lens of which can be moved to change the angular magnification.

6. An apparatus according to claim 3, further comprising plural afocal systems having different angular magnifications which are selectively inserted so as to change the angular magnification.

7. An apparatus according to claim 4, wherein the angular magnification of said afocal system and the tilt angle of said parallel plate are so adjusted that, in a case when the circuit pattern of the reticle has a relatively large minimum linewidth, the secondary light source is defined in proximity to the center of the light entrance surface of said optical integrator while, in a case when the circuit pattern of the reticle has a relatively small minimum linewidth, the secondary light source is defined in a peripheral portion of the light entrance surface of said optical integrator.

8. An apparatus according to claim 7, wherein the secondary light source as defined on the light entrance surface of said optical integrator has a substantially circular ring-like shape.

9. An apparatus according to claim 7, wherein the secondary light source as defined on the light entrance surface of said optical integrator has a substantially rectangular ring-like shape.

10. An apparatus according to claim 7, wherein, when orthogonal coordinates are defined with their origin placed on the optical axis of the beam path, the secondary light source as defined off the optical axis has separate light source portions in four quadrants, respectively, of the orthogonal coordinates.

11. An apparatus according to claim 10, wherein x and y axes of the orthogonal coordinates substantially correspond to the directions of elongation of longitudinal and transverse patterns which are major components of the circuit pattern of the reticle.

12. An apparatus according to claim 3, further comprising a stop member disposed close to one of the light entrance surface and the light exit surface of said optical integrator, said stop member having an opening corresponding to the intensity distribution of the secondary light source.

13. An apparatus according to claim 12, wherein the shape of the opening of said stop member is changeable with a change in intensity distribution of the secondary light source.

14. An apparatus according to claim 3, wherein said incoherency imparting optical system includes a plurality of half mirrors for amplitude-dividing the coherent beam.

15. An apparatus according to claim 3, wherein an image of the secondary light source is defined on an entrance pupil of said projection optical system.

16. An apparatus according to claim 3, further comprising a controller and input means for inputting information about a minimum linewidth pattern of the circuit pattern of the reticle into said controller, wherein said controller controls the angular magnification of said afocal system in accordance with the inputted information.

17. An apparatus according to claim 16, wherein said input means comprises means for reading a bar code recorded on the reticle.

18. A semiconductor device manufacturing method, comprising the steps of:
amplitude-dividing a coherent beam from a radiation source into plural beams;
imparting an optical path length difference, not less than a coherent length of the coherent beam, to the divided beams;
projecting the divided beams to a secondary light source forming member to define a secondary light source with the divided beams;
illuminating a pattern with a secondary beam from the secondary light source;
changing the section of the coherent beam so as to select one of (i) a first state wherein a light intensity distribution having a higher intensity at a central portion thereof than at a peripheral portion thereof, is formed on a light entrance surface of the secondary light source forming member and (ii) a second state wherein a light intensity distribution having a higher intensity at a peripheral portion thereof than at a central portion thereof, is formed on the light entrance surface of the secondary light source forming member; and
projecting an image of the pattern to a wafer for transfer of the pattern onto the wafer.

19. A semiconductor device manufacturing method, comprising the steps of:

dividing a beam from a radiation source into plural beams;

projecting the divided beams to a light entrance surface of an optical integrator;

adjusting the sectional shape of each of the divided beams upon the light entrance surface of the optical integrator, wherein, through said adjustment, one of a first intensity distribution having a higher intensity at its central portion than at its peripheral portion and a second intensity distribution having a lower intensity at its central portion than at its peripheral portion can be selectively defined on the light entrance surface; and illuminating a reticle with an exposure beam from a light exit surface of the optical integrator, by which a pattern of the reticle can be transferred to a semiconductor wafer.

20. A method according to claim 19, further comprising dividing the beam from the radiation source into four and wherein each of the four divided beams has one of an oblate shape and a compressed shape.

21. A method according to claim 20, wherein the beam from the radiation source has one of an oblate shape and a compressed sectional shape and further comprising dividing the beam from the radiation source into at least four.

22. A method according to claim 21, further comprising adjusting the sectional shape of the beam from the radiation source by an afocal optical system.

23. An illumination device comprising:

providing means for providing a plurality of radiation beams, said providing means comprising a beam splitter for amplitude-splitting a radiation beam into the plurality of radiation beams and a variable magnification optical system for changing the section of each of the radiation beams;

an optical integrator for receiving the radiation beams and for defining a secondary light source; and a condensing optical system for directing a secondary beam from said secondary light source to a surface to be illuminated.

24. A device according to claim 23, further comprising a parallel plate disposed on a path of said radiation beams and having a variable tilt angle with respect to the path, wherein changing the tilt angle of said parallel plate is contributable to changing the position of incidence of each of the radiation beams upon said optical integrator.

25. A projection exposure apparatus comprising:

providing means for providing a plurality of exposure beams, said providing means comprising a beam splitter for amplitude-splitting a radiation beam into the plurality of radiation beams and a variable magnification optical system for changing the section of each of the radiation beams;

an optical integrator for receiving the exposure beams and for defining a secondary light source;

a condensing optical system for directing a secondary beam from said secondary light source to a reticle; and a projection optical system for projecting an image of a circuit pattern of the reticle, illuminated with the secondary beam, to a workpiece.

26. An apparatus according to claim 25, further comprising a parallel plate disposed on a path of said exposure beams and having a variable tilt angle with respect to the path, wherein changing the tilt angle of said parallel plate is contributable to changing the position of incidence of each of the exposure beams upon said optical integrator.

27. An apparatus according to claim 26, wherein the magnification of said variable magnification optical system and the tilt angle of said parallel plate are so adjusted that, in a case when the circuit pattern of the reticle has a relatively large minimum linewidth, the secondary light source is defined in proximity to the center of the light entrance surface of said optical integrator while, in a case when the circuit pattern of the reticle has a relatively small minimum linewidth, the secondary light source is defined in a peripheral portion of the light entrance surface of said optical integrator.

28. An apparatus according to claim 27, wherein the secondary light source as defined on the light entrance surface of said optical integrator has a substantially circular ring-like shape.

29. An apparatus according to claim 27, wherein the secondary light source as defined on the light entrance surface of said optical integrator has a substantially rectangular ring-like shape.

30. An apparatus according to claim 27, wherein, when orthogonal coordinates are defined with their origin placed on the optical axis of the beam path, the secondary light source as defined off the optical axis has separate light source portions in four quadrants, respectively, of the orthogonal coordinates.

31. An apparatus according to claim 30, wherein x and y axes of the orthogonal coordinates substantially correspond to the directions of elongation of longitudinal and transverse patterns which are major components of the circuit pattern of the reticle.

32. An apparatus according to claim 25, further comprising a stop member disposed close to one of the light entrance surface and the light exit surface of said optical integrator, said stop member having an opening corresponding to the intensity distribution of the secondary light source.

33. An apparatus according to claim 32, wherein the shape of the opening of said stop member is changeable with a change in intensity distribution of the secondary light source.

34. An apparatus according to claim 25, wherein an image of the secondary light source is defined on an entrance pupil of said projection optical system.

35. An apparatus according to claim 25, further comprising a controller and input means for inputting information about a minimum linewidth pattern of the circuit pattern of the reticle into said controller, wherein said controller controls the magnification of said variable magnification system in accordance with the inputted information.

36. An apparatus according to claim 35, wherein said input means comprises means for reading a bar code recorded on the reticle.

37. A device manufacturing method comprising the steps of:

projecting a plurality of radiation beams to a light entrance surface of an optical integrator;

adjusting the sectional shape of each of the radiation beams upon the light entrance surface of the optical integrator, to selectively define one of a first intensity distribution having a higher intensity at its central portion than at its peripheral portion and a second intensity distribution having a lower intensity at its central portion than at its peripheral portion on the light entrance surface; and illuminating a reticle with an exposure beam from a light exit surface of the optical integrator, by which a pattern of the reticle can be transferred to a semiconductor wafer.

38. A projection exposure apparatus comprising:

secondary light source defining means for selectively defining, by using a radiation beam from a radiation source, one of a first secondary light source having a substantially rectangular ring-like shape and a secondary light source having a shape different from that of the first secondary light source;

projecting means for projecting, to a pattern, a beam from the secondary light source defined by said secondary light source defining means; and an imaging optical system for imaging the pattern irradiated with the beam from the secondary light source defined by said secondary light source defining means.

39. An apparatus according to claim 38, wherein said secondary light source defining means defines the second secondary light source in a case when the pattern has a relatively large minimum linewidth, while said secondary light source defining means defines the first secondary light source in a case when the pattern has a relatively small minimum linewidth.

40. A device manufacturing method comprising the steps of:

illuminating a device pattern with a beam from a secondary light source to image the device pattern on and transfer the device pattern onto a workpiece; and controlling the shape of the secondary light source such that the secondary light source has a substantially rectangular ring-like shape in a case when the device pattern has a relatively small minimum linewidth and such that the secondary light source has a shape different from the rectangular ring-like shape in a case when the device pattern has a relatively large minimum linewidth.

41. An illumination device comprising:

providing means for providing a plurality of coherent beams, said providing means comprising means for imparting an optical path length difference, not less than a coherent length of each of the beams, and a variable magnification optical system for changing the section of each of the coherent beams;

an optical integrator for receiving the coherent beams and for defining a secondary light source; and a condensing optical system for directing a secondary beam from said secondary light source to a surface to be illuminated.

42. A projection exposure apparatus comprising:

providing means for providing a plurality of coherent beams, said providing means comprising means for imparting an optical path length difference, not less than a coherent length of each of the beams, to the coherent beams and a variable magnification optical system for changing the section of each of the coherent means;

an optical integrator for receiving the coherent beams and for defining a secondary light source;

a condensing optical system for directing a secondary beam from said secondary light source to a reticle; and a projection optical system for projecting an image of a circuit pattern of the reticle, illuminated with the secondary beam, to a workpiece.

43. An apparatus according to claim 42, wherein the magnification of said variable magnification optical system is adjusted so that the secondary light source is defined in proximity to the center of a light entrance surface of said optical integrator when the circuit pattern of the reticle has a relatively large minimum linewidth, and the secondary light source is defined in a peripheral portion of the light entrance surface of said optical integrator when the circuit pattern of the reticle has a relatively small minimum linewidth.

44. An apparatus according to claim 43, wherein the secondary light source as defined on the light entrance surface of said optical integrator has a substantially circular ring-like shape.

45. An apparatus according to claim 43, wherein the secondary light source as defined on the light entrance surface of said optical integrator has a substantially rectangular ring-like shape.

46. An apparatus according to claim 43, wherein, when orthogonal coordinate axes are defined with their origin placed on the optical axis of the beam path, the secondary light source as defined off the optical axis has separate light source portions in four quadrants, respectively, of the orthogonal coordinates.

47. An apparatus according to claim 46, wherein x and y axes of the orthogonal coordinate axes substantially correspond to the directions of elongation of longitudinal and transverse patterns, which are major components of the circuit pattern of the reticle.

48. An apparatus according to claim 42, further comprising a stop member disposed close to one of the light entrance surface and the light exit surface of said optical integrator, said stop member having an opening corresponding to the intensity distribution of the secondary light source.

49. An apparatus according to claim 48, wherein the shape of the opening of said stop member is changeable with a change in intensity distribution of the secondary light source.

50. A projection exposure apparatus comprising:

providing means for providing a plurality of exposure beams;

an optical integrator for receiving the exposure beams and for defining a secondary light source;

a condensing optical system for directing a secondary beam from said secondary light source to a reticle; and a projection optical system for projecting an image of a circuit pattern of the reticle, illuminated with the secondary beam, to a workpiece, wherein said providing means comprises a variable magnification optical system for changing the section of each of the exposure beams impinging on said optical integrator, and the magnification of said variable magnification optical system is adjusted so that the secondary light source is defined in proximity to the center of a light entrance surface of said optical integrator when the circuit pattern of the reticle has a relatively large minimum linewidth, and so that the secondary light source is defined in a peripheral portion of the light entrance surface of said optical integrator when the circuit pattern of the reticle has a relatively small linewidth.

51. An apparatus according to claim 50, wherein the secondary light source as defined on the light entrance surface of said optical integrator has a substantially circular ring-like shape, when the circuit pattern of the reticle has a relatively small minimum linewidth.

52. An apparatus according to claim 50, wherein the secondary light source as defined on the light entrance surface of said optical integrator has a substantially rectangular ring-like shape, when the circuit pattern of the reticle has a relatively small minimum linewidth.

53. An apparatus according to claim 50, wherein, when orthogonal coordinate axes are defined with their origin placed on the optical axis of the beam path, the secondary light source as defined off the optical axis has separate light source portions in four quadrants, respectively, of the orthogonal coordinate axes, when the circuit pattern of the reticle has a relatively small minimum linewidth.

54. An apparatus according to claim 53, wherein x and y axes of the orthogonal coordinate axes substantially correspond to the directions of elongation of longitudinal and transverse patterns, which are major components of the circuit pattern of the reticle.

55. An apparatus according to claim 50, further comprising a stop member disposed close to one of the light entrance surface and the light exit surface of said optical integrator, said stop member having an opening corresponding to the intensity distribution of the secondary light source.

56. An apparatus according to claim 55, wherein the shape of the opening of said stop member is changeable with a change in intensity distribution of the secondary light source.

57. An apparatus according to claim 50, wherein said providing means comprises means for amplitude-splitting a coherent beam into the exposure beams and for imparting an optical path difference, not less than a coherent length of the coherent beam, to the exposure beams.

* * * * *

UNITED STATES PATENT AND TRADEMARK OFFICE
CERTIFICATE OF CORRECTION

PATENT NO. : 5,363,170

DATED : November 8, 1994

INVENTOR(S) : Masato MURAKI

It is certified that error appears in the above-indentified patent and that said Letters Patent is hereby corrected as shown below:

ON THE COVER PAGE:

UNDER "U.S. PATENT DOCUMENTS":

The following should be inserted:

```
--4,851,978  7/1989  Ichihara        362/268
  4,937,619  6/1990  Fukuda, et al.  355/53
  5,237,367  8/1993  Kudo            355/67
  5,245,384  9/1993  Mori            355/67
  5,296,892  3/1994  Mori            355/67
  5,305,054  4/1994  Suzuki, et al.  355/53
  5,317,450  5/1994  Kamon           359/566--.
```

COLUMN 1:

Line 6, "Jul. 28, 1991" should read --Jul. 28, 1992--.

COLUMN 2:

Line 4, "remains" should read --remain--.

UNITED STATES PATENT AND TRADEMARK OFFICE
CERTIFICATE OF CORRECTION

PATENT NO. : 5,363,170
DATED : November 8, 1994
INVENTOR(S) : Masato MURAKI

It is certified that error appears in the above-indentified patent and that said Letters Patent is hereby corrected as shown below:

<u>COLUMN 6</u>:

Line 46, "242a" should read --24a--.

<u>COLUMN 11</u>:

Line 14, "beam" should read --beams--.

Signed and Sealed this

Second Day of May, 1995

Attest:

BRUCE LEHMAN

Attesting Officer     Commissioner of Patents and Trademarks